(12) United States Patent
Yeh et al.

(10) Patent No.: US 12,449,728 B2
(45) Date of Patent: Oct. 21, 2025

(54) HIGH QUANTUM EFFICIENCY DRY RESIST FOR LOW EXPOSURE DOSE OF EUV RADIATION

(71) Applicant: ENTEGRIS, INC., Billerica, MA (US)

(72) Inventors: Tse-An Yeh, Taipei (TW); Montray Leavy, Singapore (SG); Chun Kuang Chen, Zhubei (TW)

(73) Assignee: ENTEGRIS, INC., Billerica, MA (US)

( * ) Notice: Subject to any disclaimer, the term of this patent is extended or adjusted under 35 U.S.C. 154(b) by 510 days.

(21) Appl. No.: 17/727,133

(22) Filed: Apr. 22, 2022

(65) Prior Publication Data

US 2022/0350242 A1 Nov. 3, 2022

Related U.S. Application Data

(60) Provisional application No. 63/178,911, filed on Apr. 23, 2021.

(51) Int. Cl.
*G03F 7/004* (2006.01)
*G03F 7/20* (2006.01)
*H01L 21/027* (2006.01)

(52) U.S. Cl.
CPC ........ *G03F 7/0042* (2013.01); *H01L 21/0274* (2013.01); *G03F 7/2004* (2013.01)

(58) Field of Classification Search
CPC ...... G03F 7/0042; G03F 7/2004; G03F 7/167; H01L 21/0274
See application file for complete search history.

(56) References Cited

U.S. PATENT DOCUMENTS

| 9,778,561 | B2 | 10/2017 | Marks |
| 9,996,004 | B2 | 6/2018 | Smith |
| 2005/0208763 | A1* | 9/2005 | Byun ............... H01L 21/76876 438/653 |
| 2007/0116887 | A1 | 5/2007 | Faguet |
| 2014/0193975 | A1* | 7/2014 | Ogihara ................ G03F 7/36 438/702 |
| 2015/0166576 | A1 | 6/2015 | Dussarrat |
| 2016/0137671 | A1 | 5/2016 | Steiger |
| 2016/0196980 | A1 | 7/2016 | Degai |
| 2016/0273107 | A1 | 9/2016 | Kim |
| 2020/0058492 | A1 | 2/2020 | Singhal |
| 2020/0263297 | A1 | 8/2020 | Jussila |

(Continued)

FOREIGN PATENT DOCUMENTS

| JP | 6495025 B2 | 11/2015 |
| JP | 2017116923 A | 6/2017 |

(Continued)

*Primary Examiner* — Michael G Miller

(57) ABSTRACT

The present disclosure provides a module for creating a metal-containing film, including a reactor chamber; an inlet for providing an organo-metallic precursor to the reactor chamber; and an inlet for providing a reactive gaseous species to react with the organo-metallic precursor to form a metal-containing film. The reactive gaseous species includes an element having three to five valence electrons and one or more radicals selected from hydrogen, $C_1$-$C_3$ alkyl, and $C_1$-$C_3$ alkoxyl. The present disclosure further relates to a method of creating the metal-containing film and a semiconductor structure associated therewith.

14 Claims, 6 Drawing Sheets

(56) References Cited

U.S. PATENT DOCUMENTS

2020/0312662 A1 10/2020 Chang
2021/0002765 A1 1/2021 Sato
2021/0013034 A1 1/2021 Wu

FOREIGN PATENT DOCUMENTS

| WO | 2020102085 A1 | 5/2020 |
| WO | 2020263750 A1 | 12/2020 |
| WO | 2020264557 A1 | 12/2020 |
| WO | 2020264571 A1 | 12/2020 |
| WO | 2021067632 A2 | 4/2021 |
| WO | 2022016127 A1 | 1/2022 |

\* cited by examiner

HIGH QUANTUM EFFICIENCY DRY RESIST FOR LOW EXPOSURE DOSE OF EUV RADIATION

TECHNICAL FIELD

The present disclosure generally relates to semiconductor manufacturing processes and modules associated therewith. Particularly, the present disclosure relates to the formation of a photopatternable metal-containing film, which may serve as a photoresist (PR) for an extreme ultraviolet (EUV) photolithography process. The present disclosure further relates to a semiconductor structure containing a PR residue.

BACKGROUND

Reliably producing nanometer features is one of the key requirements of semiconductor manufacturing. With the continued miniaturization of integrated circuit (IC) technology, the dimensions of the size and pitch of circuit features have placed additional demands on processing capabilities. Scaling of features on advanced semiconductor integrated circuits (ICs) and other devices is driving lithography to improve resolution.

EUV lithography can extend lithographic technology beyond its optical limits by moving to smaller imaging source wavelengths achievable with current photolithography methods to pattern small, critical dimension features. In EUV photolithography, patterns are printed by emitting photons from a photon source onto a mask and printing the pattern onto a photosensitive PR, thereby causing a chemical reaction in the PR that, after development, removes certain portions of the PR to form the pattern.

Conventional lithography makes use of a polymer-based chemically amplified resists (CARs), so-called wet PR, which are generally patterned by way of a typical spin-on coating process. CARs can be used as radiation patterned resists so that a radiation pattern is used to alter the chemical structure of the CARs corresponding with the pattern. Since the quantum efficiency of CAR is low, a thick CAR should be used in EUV lithography to absorb sufficient EUV photos for initiating a chemical reaction. Thick CARs no longer meet the demands for advanced technology nodes, such as 3 nm (N3), 2 nm (N2) nodes or beyond, which require a thin PR due to size reduction of circuits. An alternative to CARs is directly photopatternable metal oxide containing films (so-called dry PRs). Compared to CARs, directly photopatternable metal oxide containing films generally have improved EUV quantum efficiency, making them a promising candidate to replace CARs. However, the use of directly photopatternable metal oxide containing films, e.g., CoO, comes at a very high chip fabrication cost.

There is an urgent need for a new dry PR with high EUV quantum efficiency so that its usable thickness not only fulfills the demands for advanced technology nodes but also reduces IC manufacturing cost.

SUMMARY

The following presents a simplified summary of the basic features of the present disclosure in order to provide a basic understanding of some its aspects.

The inventors have unexpectedly found that the metal-containing film according to the present disclosure shows dramatically improved EUV quantum efficiency. Consequently, under the same through-the-lens (TTL) condition, the exposure dose of EUV radiation can be reduced to a great extent, so the metal-containing film according to the present disclosure is particularly suitable for lithography with very low EUV radiation dose.

In some embodiments, the present disclosure provides a module for fabricating the metal-containing film. The module includes a reactor chamber, an inlet for providing an organo-metallic precursor to the reactor chamber, and an inlet for providing a reactive gaseous species to react with the organo-metallic precursor to form a metal-containing film. The reactive gaseous species includes an element having three to five valence electrons and one or more radicals selected from hydrogen, $C_1$-$C_3$ alkyl, and $C_1$-$C_3$ alkoxyl.

In some embodiments, the present disclosure provides a method of fabricating the metal containing film. The method includes the following operations: creating a metal-containing film by reacting an organo-metallic precursor with a reactive gaseous species. The reactive gaseous species includes an element having three to five valence electrons and one or more radicals selected from hydrogen, $C_1$-$C_3$ alkyl, and $C_1$-$C_3$ alkoxyl.

In some embodiments, the present disclosure provides a semiconductor structure containing the residue of the metal-containing film that has been subjected to a development process. The semiconductor structure includes a substrate, one or more features on the substrate, and a residue of the metal-containing film.

BRIEF DESCRIPTION OF THE DRAWINGS

Aspects of some embodiments of the present disclosure are readily understood from the following detailed description when read with the accompanying figures. It should be noted that various structures may not be drawn to scale, and dimensions of the various structures may be arbitrarily increased or reduced for clarity of discussion.

DESCRIPTION

Figure 1:
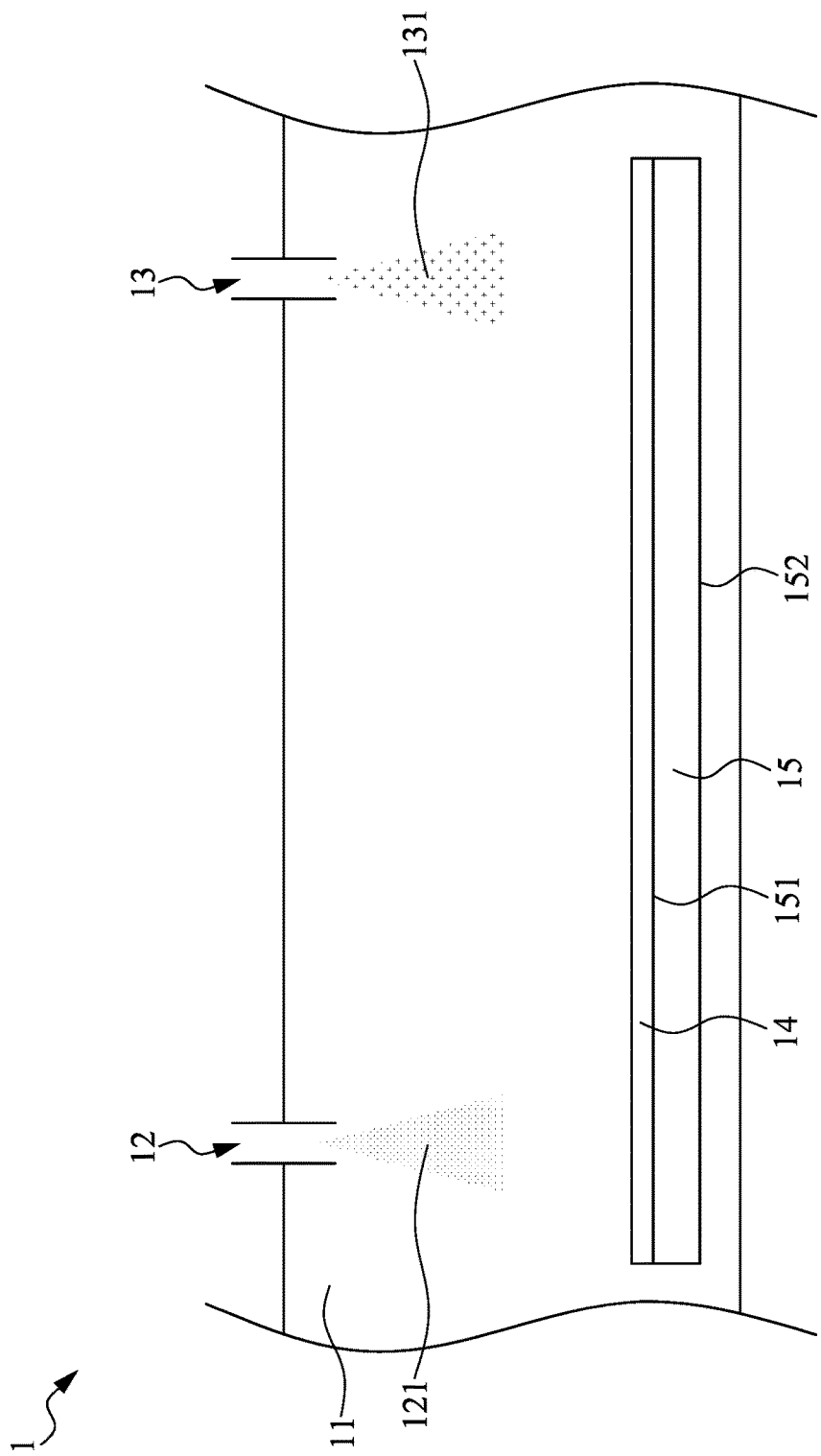
FIG. 1 shows the layout of the module according to an embodiment of the present disclosure.

To make the figures clear and concise, unless otherwise specified, the same reference numerals in different figures indicate the same components. In addition, to simplify the description, descriptions and details of well-known steps and components may be omitted. The word "approximately," "substantially" or "basically" used herein means that a value of a component has a parameter that is expected to be close to a stated value or position. However, as is well known in the art, there are always small differences that prevent a value or position from being exactly the stated value or position. It is acknowledged in the art that a deviation of up to at least ten percent (10%) (and even to twenty percent (20%) for some components including semiconductor doping concentrations) is a reasonable deviation from an ideal target exactly as described. The terms "first," "second," "third", and the like (as used in part of a component name) in the claims and/or specific embodiments are used to distinguish similar components, and do not necessarily describe an order in time, space, rank, or any other way. It should be understood that, such terms may be interchanged under appropriate circumstances, and the embodiments described herein may be operated in other orders than that described or exemplified herein. The term "some embodiments" means that specific features, structures, or characteristics described in combination with the embodiments are included in at least one embodiment of the present disclosure. Therefore, the phrase "in some embodiments" appearing at various locations throughout this specification does not necessarily refer to the same embodiment, but in some cases, may refer to the same embodiment. In addition, it is apparent to a person of ordinary skill in the art that, in one or more embodiments, specific features, structures, or characteristics may be combined in any appropriate manner.

In this specification, "positive PR" refers to a PR that makes exposed regions transformed to make such regions selectively removable. The term "negative PR" refers to a PR that makes unexposed regions more readily removable. The term "quantum efficiency" used herein is defined as the ratio of the number of primary electrons generated per unit volume of the PR to the number of EUV photons at a wavelength of 13.5 nm incident on the unit volume. The compositional or structural parameters of the molecule or semiconductor described herein can be verified by way of any known material characterization method, such as RBS, Raman, XRD, FTIR, TEM, SEM, etc.

The following disclosure provides various embodiments or examples for implementing different features of the present disclosure. Specific examples of components and arrangements are described below. Certainly, the descriptions are merely examples and not intended to be limiting. In this application, in the following descriptions, the description of the first feature being formed on or above the second feature may include an embodiment formed by direct contact between the first feature and the second feature, and may further include an embodiment in which an additional feature may be formed between the first feature and the second feature to enable the first feature and the second feature to be not in direct contact. In addition, in this application, reference numerals and/or letters may be repeated in examples. This repetition is for the purpose of simplification and clarity, and does not indicate a relationship between the described various embodiments and/or configurations.

The embodiments of the present disclosure are described in detail below. However, it should be understood that many applicable concepts provided by the present disclosure may be implemented in a plurality of specific environments. The described specific embodiments are only illustrative and do not limit the scope of the present disclosure.

A desirable dry PR will be an EUV absorber, for example, those with an absorption coefficient greater than 2 $\mu m^{-1}$, and may have a relatively broad absorption profile, high melting point, low malleability/high physical stability and be readily deposited. Typically, a dry PR with higher quantum efficiency would have a smaller dose-to-clear thickness, and vice versa. For a negative PR, strongly absorbed light will sensitize the molecules of the PR, e.g., a cross-linking effect, so that the exposed portions have more resistance to the active species during development than the unexposed portions. Given this, an object of the present disclosure is to provide a metal-containing film, as a directly photopatternable film or dry PR, with improved quantum efficiency. In this connection, the first aspect of present disclosure is to provide a module for producing the metal-containing film.

FIG. 1 shows a module (1) according to an embodiment of the present disclosure. The module (1) includes a reactor chamber (11); an inlet (12) for providing an organo-metallic precursor (121) to the reactor chamber (11); and an inlet (13) for providing a reactive gaseous species (131) to react with the organo-metallic precursor (121) to form a metal-containing film (14), wherein the reactive gaseous species (131) includes an element having three to five valence electrons and one or more radicals selected from hydrogen, $C_1$-$C_3$ alkyl, and $C_1$-$C_3$ alkoxyl.

Optionally, the metal-containing film (14) may be formed on a supporting material or substrate (15). The supporting material or substrate (15) has a surface (151) and another surface (152) opposite to the surface (151), in which the metal-containing film (14) is created on the surface (151). The metal-containing film (14) may be in direct contact with the surface 151). The metal-containing film (14) may not be in direct contact with the surface (151). The material of the supporting material or substrate (15) is not particularly restricted. Any supporting material or substrate used in a typical semiconductor manufacturing process is suitable for creating the metal-containing film (14). Examples of the supporting material or substrate (15) include, but is are not limited to, Si in single crystalline, polycrystalline or amorphous form, sapphire, GaN, ZnO, a metal (e.g., Al, Cu, Ni or Au), a dielectric (e.g., an oxide or a nitride), a polymer, an organo-metallic film, etc. The structure of the surface (151) or (152) is not particularly limited. In some embodiments, the surface (151) may be planar with a root mean square (RMS) roughness less than 10 Å, for example 1, 2, 3, 4, 5, 6, 7, 8, 9 or 10 Å. In other embodiments, the surface (151) may have one or more features (not shown in FIG. 1) in direct contact with the surface (151). In some embodiments, the one or more features extend outward and along the direction perpendicular to the surface (151) with a length of 10 Å or more, particularly 10 Å to 1 µm, and more preferably 10 Å to 100 nm. Examples of the length of the one or more features that extend along the direction perpendicular to the surface (151) include, but are limited to, 10 Å, 20 Å, 30 Å, 40 Å, 50 Å, 60 Å, 70 Å, 80 Å, 90 Å, 100 Å, 200 Å, 300 Å, 400 Å, 500 Å, 600 Å, 700 Å, 800 Å, 900 Å, 100 nm, 120 nm, 140 nm, 150 nm, 160 nm, 180 nm, 200 nm, 250, nm, 300 nm, 350 nm, 400 nm, 450 nm, 500 nm, 600 nm, 700 nm, 800 nm, 900 nm or 1 µm. The one or more features may be periodically arranged on the surface (151). The one or more features may be randomly arranged on the surface (151).

The module (1) can be a chemical vapor deposition (CVD) or atomic layer deposition (ALD) module. The reactor chamber (11) functions to provide a space that accommodates the organo-metallic precursor (121) and reactive gaseous species (131) and accommodates the reaction occurred between the organo-metallic precursor (121) and reactive gaseous species (131). The arrangement or type of reactor chamber (11) is not particularly restricted. To prompt the reaction between the organo-metallic precursor (121) and reactive gaseous species (131), inert gas plasma (not shown in the figures) may be optionally provided in the reactor chamber (11). The inlet (12) functions to provide the organo-metallic precursor (121) to the reactor chamber (11). The arrangement or type of inlet (12) is not particularly restricted. The inlet (13) functions to provide the reactive gaseous species (131) to the reactor chamber 11). The arrangement or type of inlet (13) is not particularly restricted. To control the flow of the organo-metallic precursor (121) in the reactor chamber (11), the inlet (12) may be equipped with a mass flow controller (MFC). To control the flow of the reactive gaseous species (131) in the reactor chamber (11), the inlet (13) may be equipped with an MFC.

The method of creating the metal-containing film (14) also can be understood in view of FIG. 1. According to an embodiment of the present disclosure, the metal-containing film (14) can be created and deposited on the surface (151) of the supporting material or substrate (15) by reacting an organo-metallic precursor (121) with a reactive gaseous species (131), wherein the reactive gaseous species (121) includes an element having three to five valence electrons and one or more radicals selected from hydrogen, $C_1$-$C_3$ alkyl, and $C_1$-$C_3$ alkoxyl. The deposition may be conducted by CVD or ALD.

The element having three to five valence electrons described herein is preferably selected from the elements of Group IIIA, elements of Group IVA and elements of Group VA. The element having three valence electrons is preferably selected from Group IIIA elements. More preferably, the element having three valence electrons is B, Al, Ga or In. The element having four valence electrons is preferably selected from Group IVA elements. More preferably, the element having four valence electrons is C, Si, Ge or Sn. The element having five valence electrons is preferably selected from Group VA elements. More preferably, the element having five valence electrons is N, P, As or Sb.

The radical selected from hydrogen, $C_1$-$C_3$ alkyl, and $C_1$-$C_3$ alkoxyl described herein is preferably H, $CH_3$ or $OCH_3$. More preferably, the reactive gaseous species (131) is $B_2H_6$, $CH_4$, $SiH_4$, $GeH_4$, $SnH_4$, $NH_3$, $PH_3$, $AsH_3$ or $SbH_3$. Surprisingly, it is found that the use of the reactive gaseous species (131) according to the present disclosure can prompt the establishment of the chemical bonds between the metal element of the organo-metallic precursor (121) and the element having three to five valence electrons of the reactive gaseous species (131); this plays an important role in improving the quantum efficiency of the metal-containing film (14) as discussed in the subsequent paragraphs.

The organo-metallic precursor (121) preferably has the following formula: $M(R^1)_w(R^2)_x(R^3)_y(R^4)_z$, in which M denotes a metal element having a valence of 2 to 4, $R^1$ to $R^4$, each independently, denote halo, $C_1$-$C_6$ alkyl, $C_1$-$C_6$ alkoxyl, an amido group, a $C_1$-$C_6$ alkylamino group, or a (di-$C_1$-$C_6$ alkyl)amino group, w, x, y and z, each independently, denote an integer of 0 to 4, wherein $2 \leq w+x+y+z \leq 4$, and at least one of $R^1$, $R^2$, $R^3$ and $R^4$ denotes $C_1$-$C_6$ alkyl, $C_1$-$C_6$ alkoxyl, an amido group, a $C_1$-$C_6$ alkylamino group, or a (di-$C_1$-$C_6$ alkyl)amino group.

M preferably denotes Ti, Zn, Zr, Ru, Sn, Sb, or Hf, and more preferably Sn or Sb. In $R^1$ to $R^4$, the halo is preferably, F, Cl Br or I, and more preferably F or Cl. Preferably, M and $R^1$ to $R^4$ are selected from the following combinations:

| M | $R^1$ to $R^4$ |
|---|---|
| Ti | F or $C_1$-$C_6$ alkyl, |
|  | F or $C_1$-$C_6$ alkoxyl |
|  | F or an amido group |
|  | F or a $C_1$-$C_6$ alkylamino group |
|  | F or a (di-$C_1$-$C_6$ alkyl)amino group |
|  | Cl or $C_1$-$C_6$ alkyl, |
|  | Cl or $C_1$-$C_6$ alkoxyl |
|  | Cl or an amido group |
|  | Cl or a $C_1$-$C_6$ alkylamino group |
|  | Cl or a (di-$C_1$-$C_6$ alkyl)amino group |
|  | Br or $C_1$-$C_6$ alkyl, |
|  | Br or $C_1$-$C_6$ alkoxyl |
|  | Br or an amido group |
|  | Br or a $C_1$-$C_6$ alkylamino group |
|  | Br or a (di-$C_1$-$C_6$ alkyl)amino group |
|  | I or $C_1$-$C_6$ alkyl, |
|  | I or $C_1$-$C_6$ alkoxyl |
|  | I or an amido group |
|  | I or a $C_1$-$C_6$ alkylamino group |
|  | I or a (di-$C_1$-$C_6$ alkyl)amino group |
| Zn | F or $C_1$-$C_6$ alkyl, |
|  | F or $C_1$-$C_6$ alkoxyl |
|  | F or an amido group |
|  | F or a $C_1$-$C_6$ alkylamino group |
|  | F or a (di-$C_1$-$C_6$ alkyl)amino group |
|  | Cl or $C_1$-$C_6$ alkyl, |
|  | Cl or $C_1$-$C_6$ alkoxyl |
|  | Cl or an amido group |
|  | Cl or a $C_1$-$C_6$ alkylamino group |
|  | Cl or a (di-$C_1$-$C_6$ alkyl)amino group |
|  | Br or $C_1$-$C_6$ alkyl, |
|  | Br or $C_1$-$C_6$ alkoxyl |
|  | Br or an amido group |
|  | Br or a $C_1$-$C_6$ alkylamino group |
|  | Br or a (di-$C_1$-$C_6$ alkyl)amino group |
|  | I or $C_1$-$C_6$ alkyl, |
|  | I or $C_1$-$C_6$ alkoxyl |
|  | I or an amido group |
|  | I or a $C_1$-$C_6$ alkylamino group |
|  | I or a (di-$C_1$-$C_6$ alkyl)amino group |
| Zr | F or $C_1$-$C_6$ alkyl, |
|  | F or $C_1$-$C_6$ alkoxyl |
|  | F or an amido group |
|  | F or a $C_1$-$C_6$ alkylamino group |
|  | F or a (di-$C_1$-$C_6$ alkyl)amino group |
|  | Cl or $C_1$-$C_6$ alkyl, |
|  | Cl or $C_1$-$C_6$ alkoxyl |
|  | Cl or an amido group |
|  | Cl or a $C_1$-$C_6$ alkylamino group |
|  | Cl or a (di-$C_1$-$C_6$ alkyl)amino group |
|  | Br or $C_1$-$C_6$ alkyl, |
|  | Br or $C_1$-$C_6$ alkoxyl |
|  | Br or an amido group |
|  | Br or a $C_1$-$C_6$ alkylamino group |
|  | Br or a (di-$C_1$-$C_6$ alkyl)amino group |
|  | I or $C_1$-$C_6$ alkyl, |
|  | I or $C_1$-$C_6$ alkoxyl |
|  | I or an amido group |
|  | I or a $C_1$-$C_6$ alkylamino group |
|  | I or a (di-$C_1$-$C_6$ alkyl)amino group |
| Ru | F or $C_1$-$C_6$ alkyl, |
|  | F or $C_1$-$C_6$ alkoxyl |
|  | F or an amido group |
|  | F or a $C_1$-$C_6$ alkylamino group |
|  | F or a (di-$C_1$-$C_6$ alkyl)amino group |
|  | Cl or $C_1$-$C_6$ alkyl, |
|  | Cl or $C_1$-$C_6$ alkoxyl |
|  | Cl or an amido group |
|  | Cl or a $C_1$-$C_6$ alkylamino group |
|  | Cl or a (di-$C_1$-$C_6$ alkyl)amino group |
|  | Br or $C_1$-$C_6$ alkyl, |
|  | Br or $C_1$-$C_6$ alkoxyl |
|  | Br or an amido group |
|  | Br or a $C_1$-$C_6$ alkylamino group |
|  | Br or a (di-$C_1$-$C_6$ alkyl)amino group |
|  | I or $C_1$-$C_6$ alkyl, |
|  | I or $C_1$-$C_6$ alkoxyl |
|  | I or an amido group |
|  | I or a $C_1$-$C_6$ alkylamino group |

-continued

| M | $R^1$ to $R^4$ |
|---|---|
| | I or a (di-$C_1$-$C_6$ alkyl)amino group |
| Sn | F or $C_1$-$C_6$ alkyl, |
| | F or $C_1$-$C_6$ alkoxyl |
| | F or an amido group |
| | F or a $C_1$-$C_6$ alkylamino group |
| | F or a (di-$C_1$-$C_6$ alkyl)amino group |
| | Cl or $C_1$-$C_6$ alkyl, |
| | Cl or $C_1$-$C_6$ alkoxyl |
| | Cl or an amido group |
| | Cl or a $C_1$-$C_6$ alkylamino group |
| | Cl or a (di-$C_1$-$C_6$ alkyl)amino group |
| | Br or $C_1$-$C_6$ alkyl, |
| | Br or $C_1$-$C_6$ alkoxyl |
| | Br or an amido group |
| | Br or a $C_1$-$C_6$ alkylamino group |
| | Br or a (di-$C_1$-$C_6$ alkyl)amino group |
| | I or $C_1$-$C_6$ alkyl, |
| | I or $C_1$-$C_6$ alkoxyl |
| | I or an amido group |
| | I or a $C_1$-$C_6$ alkylamino group |
| | I or a (di-$C_1$-$C_6$ alkyl)amino group |
| Sb | F or $C_1$-$C_6$ alkyl, |
| | F or $C_1$-$C_6$ alkoxyl |
| | F or an amido group |
| | F or a $C_1$-$C_6$ alkylamino group |
| | F or a (di-$C_1$-$C_6$ alkyl)amino group |
| | Cl or $C_1$-$C_6$ alkyl, |
| | Cl or $C_1$-$C_6$ alkoxyl |
| | Cl or an amido group |
| | Cl or a $C_1$-$C_6$ alkylamino group |
| | Cl or a (di-$C_1$-$C_6$ alkyl)amino group |
| | Br or $C_1$-$C_6$ alkyl, |
| | Br or $C_1$-$C_6$ alkoxyl |
| | Br or an amido group |
| | Br or a $C_1$-$C_6$ alkylamino group |
| | Br or a (di-$C_1$-$C_6$ alkyl)amino group |
| | I or $C_1$-$C_6$ alkyl, |
| | I or $C_1$-$C_6$ alkoxyl |
| | I or an amido group |
| | I or a $C_1$-$C_6$ alkylamino group |
| | I or a (di-$C_1$-$C_6$ alkyl)amino group |
| Hf | F or $C_1$-$C_6$ alkyl, |
| | F or $C_1$-$C_6$ alkoxyl |
| | F or an amido group |
| | F or a $C_1$-$C_6$ alkylamino group |
| | F or a (di-$C_1$-$C_6$ alkyl)amino group |
| | Cl or $C_1$-$C_6$ alkyl, |
| | Cl or $C_1$-$C_6$ alkoxyl |
| | Cl or an amido group |
| | Cl or a $C_1$-$C_6$ alkylamino group |
| | Cl or a (di-$C_1$-$C_6$ alkyl)amino group |
| | Br or $C_1$-$C_6$ alkyl, |
| | Br or $C_1$-$C_6$ alkoxyl |
| | Br or an amido group |
| | Br or a $C_1$-$C_6$ alkylamino group |
| | Br or a (di-$C_1$-$C_6$ alkyl)amino group |
| | I or $C_1$-$C_6$ alkyl, |
| | I or $C_1$-$C_6$ alkoxyl |
| | I or an amido group |
| | I or a $C_1$-$C_6$ alkylamino group |
| | I or a (di-$C_1$-$C_6$ alkyl)amino group |

$C_1$-$C_6$ alkyl is preferably, $-CH_3$, $-C_2H_5$, $-C_3H_7$, $-C_4H_9$, $-C_5H_{11}$ or $-C_6H_{13}$, and more preferably $-CH_3$ or $-C_2H_5$. $C_1$-$C_6$ alkoxyl is preferably $-OCH_3$, $-OC_2H_5$, $-OC_3H_7$, $-OC_4H_9$, $-OC_5H_{11}$ or $-OC_6H_{13}$, and more preferably $-OCH_3$ or $-OC_2H_5$. The amido group is preferably $-NH_2$. The alkylamino group is preferably $-NHCH_3$, $-NHC_2H_5$, $-NHC_3H_7$, $-NHC_4H_9$, $-NHC_5H_{11}$ or $-NHC_6H_{13}$, and more preferably $-NHCH_3$ or $-NHC_2H_5$. The (di-$C_1$-$C_6$ alkyl)amino group is preferably $-N(CH_3)_2$, $-N(C_2H_5)_2$, $-N(C_3H_7)_2$, $-N(C_4H_9)_2$, $-N(C_5H_{11})_2$ or $-N(C_6H_{13})_2$, and more preferably $-N(CH_3)_2$ or $-N(C_2H_5)_2$.

In some embodiments, the organo-metallic precursor (121) may be $Ti(CH_3)_4$, $TiCl(CH_3)_3$, $TiCl_2(CH_3)_2$, $TiCl_3CH_3$, $ZnClCH_3$, $Zn(CH_3)_2$, $Zr(CH_3)_4$, $ZrCl(CH_3)_3$, $ZrCl_2(CH_3)_2$, $ZrCl_3CH_3$, $Ru(CH_3)_4$, $RuCl(CH_3)_3$, $RuCl_2(CH_3)_2$, $RuCl_3CH_3$, $Sn(CH_3)_4$, $SnCl(CH_3)_3$, $SnCl_2(CH_3)_2$, $SnCl_3CH_3$, $SbCl(CH_3)_2$, $SbCl_2CH_3$, $Sb(CH_3)_3$, $Hf(CH_3)_4$, $HfCl(CH_3)_3$, $HfCl_2(CH_3)_2$, $HfCl_3CH_3$, $Ti(OCH_3)_4$, $TiCl(OCH_3)_3$, $TiCl_2(OCH_3)_2$, $TiCl_3OCH_3$, $ZnClOCH_3$, $Zn(OCH_3)_2$, $Zr(OCH_3)_4$, $ZrCl(OCH_3)_3$, $ZrCl_2(OCH_3)_2$, $ZrCl_3OCH_3$, $Ru(OCH_3)_4$, $RuCl(OCH_3)_3$, $RuCl_2(OCH_3)_2$, $RuCl_3OCH_3$, $Sn(OCH_3)_4$, $SnCl(OCH_3)_3$, $SnCl_2(OCH_3)_2$, $SnCl_3OCH_3$, $SbCl(OCH_3)_2$, $SbCl_2OCH_3$, $Sb(OCH_3)_3$, $Hf(OCH_3)_4$, $HfCl(OCH_3)_3$, $HfCl_2(OCH_3)_2$, $HfCl_3OCH_3$, $Ti(NH_2)_4$, $TiCl(NH_2)_3$, $TiCl_2(NH_2)_2$, $TiCl_3NH_2$, $ZnClNH_2$, $Zn(NH_2)_2$, $Zr(NH_2)_4$, $ZrCl(NH_2)_3$, $ZrCl_2(NH_2)_2$, $ZrCl_3NH_2$, $Ru(NH_2)_4$, $RuCl(NH_2)_3$, $RuCl_2(NH_2)_2$, $RuCl_3NH_2$, $Sn(NH_2)_4$, $SnCl(NH_2)_3$, $SnCl_2(NH_2)_2$, $SnCl_3NH_2$, $SbCl(NH_2)_2$, $SbCl_2NH_2$, $Sb(NH_2)_3$, $Hf(NH_2)_4$, $HfCl(NH_2)_3$, $HfCl_2(NH_2)_2$, $HfCl_3NH_2$, $Ti(NHCH_3)_4$, $TiCl(NHCH_3)_3$, $TiCl_2(NHCH_3)_2$, $TiCl_3NHCH_3$, $ZnClNHCH_3$, $Zn(NHCH_3)_2$, $Zr(NHCH_3)_4$, $ZrCl(NHCH_3)_3$, $ZrCl_2(NHCH_3)_2$, $ZrCl_3NHCH_3$, $Ru(NHCH_3)_4$, $RuCl(NHCH_3)_3$, $RuCl_2(NHCH_3)_2$, $RuCl_3NHCH_3$, $Sn(NHCH_3)_4$, $SnCl(NHCH_3)_3$, $SnCl_2(NHCH_3)_2$, $SnCl_3NHCH_3$, $SbCl(NHCH_3)_2$, $SbCl_2NHCH_3$, $Sb(NHCH_3)_3$, $Hf(NHCH_3)_4$, $HfCl(NHCH_3)_3$, $HfCl_2(NHCH_3)_2$, $HfCl_3NHCH_3$, $Ti[N(CH_3)_2]_4$, $TiCl[N(CH_3)_2]_3$, $TiCl_2[N(CH_3)_2]_2$, $TiCl_3N(CH_3)_2$, $ZnClN(CH_3)_2$, $Zn[N(CH_3)_2]_2$, $Zr[N(CH_3)_2]_4$, $ZrCl[N(CH_3)_2]_3$, $ZrCl_2[N(CH_3)_2]_2$, $ZrCl_3N(CH_3)_2$, $Ru[N(CH_3)_2]_4$, $RuCl[N(CH_3)_2]_3$, $RuCl_2[N(CH_3)_2]_2$, $RuCl_3N(CH_3)_2$, $Sn[N(CH_3)_2]_4$, $SnCl[N(CH_3)_2]_3$, $SnCl_2[N(CH_3)_2]_2$, $SnCl_3N(CH_3)_2$, $SbCl[N(CH_3)_2]_2$, $SbCl_2N(CH_3)_2$, $Sb[N(CH_3)_2]_3$, $Hf[N(CH_3)_2]_4$, $HfCl[N(CH_3)_2]_3$, $HfCl_2[N(CH_3)_2]_2$ or $HfCl_3N(CH_3)_2$.

Optimized parameters for creating the metal-containing film (14) are as follows:

Temperature: 50° C. to 600° C. For example, the lower limit of the temperature range may be 50, 100, 150, 200, 250, 300, 350, 400, 450, 500 or 550° C. The upper limit of the temperature range may be 100, 150, 200, 250, 300, 350, 400, 450, 500, 550 or 600° C. The temperature range suitable for creating the metal-containing film (14) may be the combination of one of the lower limits and one of the upper limits as described above.

Working pressure: 100 to 30000 mTorr. For example, the lower limit of the working pressure range may be 100, 500, 1000, 2000, 4000, 5000, 6000, 8000, 10000, 12000, 14000, 15000, 16000, 18000, 20000, 22000, 24000, 25000, 26000 or 28000 mTorr. The upper limit of the working pressure range may be 500, 1000, 2000, 4000, 5000, 6000, 8000, 10000, 12000, 14000, 15000, 16000, 18000, 20000, 22000, 24000, 25000, 26000, 28000 or 30000 mTorr. The range of the working pressure suitable for creating the metal-containing film (14) may be the combination of one of the lower limits and one of the upper limits as described above.

Flow rates of the organo-metallic precursor (121): 0.01 and 1000 sccm. For example, the lower limit of the flow rate range of the organo-metallic precursor (121) may be 0.01, 0.05, 0.1, 0.5, 1, 5, 10, 20, 40, 50, 60, 80, 100, 200, 400, 500, 600 or 800 sccm. The upper limit of the flow rate range of the organo-metallic precursor (121) may be 0.05, 0.1, 0.5, 1, 5, 10, 20, 40, 50, 60, 80, 100, 200, 400, 500, 600, 800 or 1000 sccm. The range of the flow rates of the organo-metallic precursor (121) suitable for creating the metal-containing film (14) may be the combination of one of the lower limits and one of the upper limits as described above.

Flow rates of the reactive gaseous species (131): 10 and 10000 sccm. For example, the lower limit of the flow rate range of the gaseous species (131) may be 10, 50, 100, 500, 1000, 1500, 2000, 2500, 3000, 3500, 4000, 4500, 5000, 5500, 6000, 6500, 7000, 7500, 8000, 8500, 9000 or 9500 sccm. The upper limit of the flow rate range of the gaseous species (131) may be 50, 100, 500, 1000, 1500, 2000, 2500, 3000, 3500, 4000, 4500, 5000, 5500, 6000, 6500, 7000, 7500, 8000, 8500, 9000, 9500 or 10000 sccm. The range of the flow rates of the gaseous species (131) suitable for creating the metal-containing film (14) may be the combination of one of the lower limits and one of the upper limits as described above.

In some embodiments, if inert gas plasma is provided in the reactor chamber (11), the plasma power may range from 10 and 1000 W per 12 inch wafer station at an RF frequency of 13.56 MHz, 27.1 MHz, or higher. For example, the lower limit of the plasma power range may be 10, 50, 100, 150, 200, 250, 300, 350, 400, 450, 500, 550, 600, 650, 700, 750, 800, 850, 900 or 950 W. For example, the upper limit of the plasma power range may be 50, 100, 150, 200, 250, 300, 350, 400, 450, 500, 550, 600, 650, 700, 750, 800, 850, 900, 950 or 1000 W. The range of the plasma power suitable for creating the metal-containing film (14) may be the combination of one of the lower limits and one of the upper limits as described above.

Thus, the thicknesses of the metal-containing film (14) made in accordance with the method described herein may range from 10 and 2000 Å. For example, the lower limit of the thickness range may be 10, 50, 100, 150, 200, 250, 300, 350, 400, 450, 500, 600, 700, 800, 900, 1000, 1200, 1400, 1500, 1600 or 1800 Å. The upper limit of the thickness range may be 50, 100, 150, 200, 250, 300, 350, 400, 450, 500, 600, 700, 800, 900, 1000, 1200, 1400, 1500, 1600, 1800 or 2000 Å. The thickness range may be the combination of one of the lower limits and one of the upper limits as described above.

While not being bound to theory, the inventors believe that the chemistry associated with the method of creating the metal-containing film (14) may be illustrated as follows.

Example 1

Organo-metallic precursor (121): $SnCl_3CH_3$   Reactive gaseous species (131): $NH_3$ Reaction chemistry: $SnCl_3CH_3 + NH_3 \rightarrow Sn(Sn_2N)_3CH_3$ (primitive molecule) + volatile byproducts

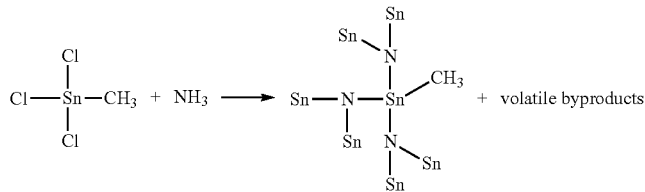

In the above reaction chemistry, the resulting reaction product is represented by a primitive molecule, i.e., $Sn(Sn_2N)_3CH_3$, for simplification. The $Sn(Sn_2N)_3CH_3$ primitive molecule has seven tin elements, including one central tin element and six tin elements surrounding the central tin element. Although only the bonding states regarding the central tin element are shown, it should be noted that, each of the tin elements may be bonded with up to three nitrogen elements and one methyl group; whereas each of the nitrogen elements may be bonded with up to three tin elements.

Example 2

Organo-metallic precursor (121): $SnCl_3CH_3$   Reactive gaseous species (131): $SiH_4$ Reaction chemistry: $SnCl_3CH_3 + SiH_4 \rightarrow Sn(Sn_3Si)_3CH_3$ (primitive molecule) + volatile byproducts

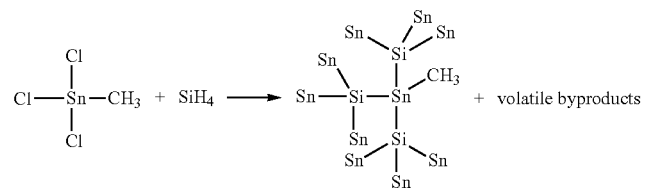

In the above reaction chemistry, the resulting reaction product is represented by a primitive molecule, i.e., $Sn(Sn_3Si)_3CH_3$, for simplification. The $Sn(Sn_3Si)_3CH_3$ primitive molecule has ten tin elements, including one central tin element and nine tin elements surrounding the central tin element. Although only the bonding states regarding the central tin element are shown, it should be noted that, each of the tin elements may be bonded with up to three silicon elements and one methyl group; whereas each of the silicon elements may be bonded with up to four tin elements.

Example 3

Organo-metallic precursor (121): Sb(CH$_3$)$_3$  Reactive gaseous species (131): NH$_3$ Reaction chemistry: Sb(CH$_3$)$_3$ + NH$_3$ → Sb(Sb$_2$N)$_2$CH$_3$ (primitive molecule) + volatile byproducts

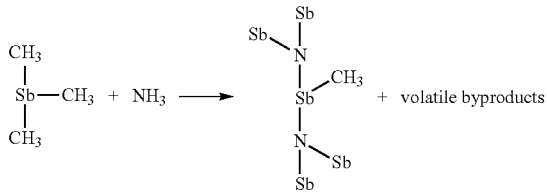

In the above reaction chemistry, the resulting reaction product is represented by a primitive molecule, i.e., Sb(Sb$_2$N)$_2$CH$_3$, for simplification The Sb(Sb$_2$N)$_2$CH$_3$ primitive molecule has five antimony elements, including one central antimony element and four antimony elements surrounding the central antimony element. Although only the bonding states regarding the central antimony element are shown, it should be noted that, each of the antimony elements may be bonded with up to two nitrogen elements and one methyl group; whereas each of the nitrogen elements may be bonded with up to three antimony elements.

Example 4

Organo-metallic precursor (121): Sb(CH$_3$)$_3$  Reactive gaseous species (131): SiH$_4$ Reaction chemistry: Sb(CH$_3$)$_3$ + SiH$_4$ → Sb(Sb$_3$Si)$_2$CH$_3$ (primitive molecule) + volatile byproducts

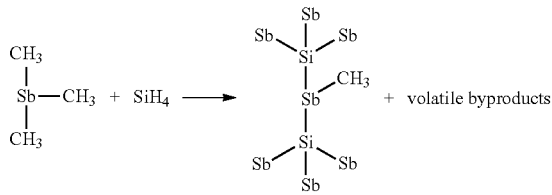

In the above reaction chemistry, the resulting reaction product is represented by a primitive molecule, i.e., Sb(Sb$_3$Si)$_2$CH$_3$, for simplification. The Sb(Sb$_3$Si)$_2$CH$_3$ primitive molecule has seven antimony elements, including one central antimony element and six antimony elements surrounding the central antimony element. Although only the bonding states regarding the central antimony element are shown, it should be noted that, each of the antimony elements may be bonded with up to two silicon elements and one methyl group; whereas each of the silicon elements may be bonded with up to four antimony elements.

The same reaction chemistry can be applied to the other organo-metallic precursors (121) and reactive gaseous species (131) as previously mentioned and is not repeated herein.

Figure 2A:
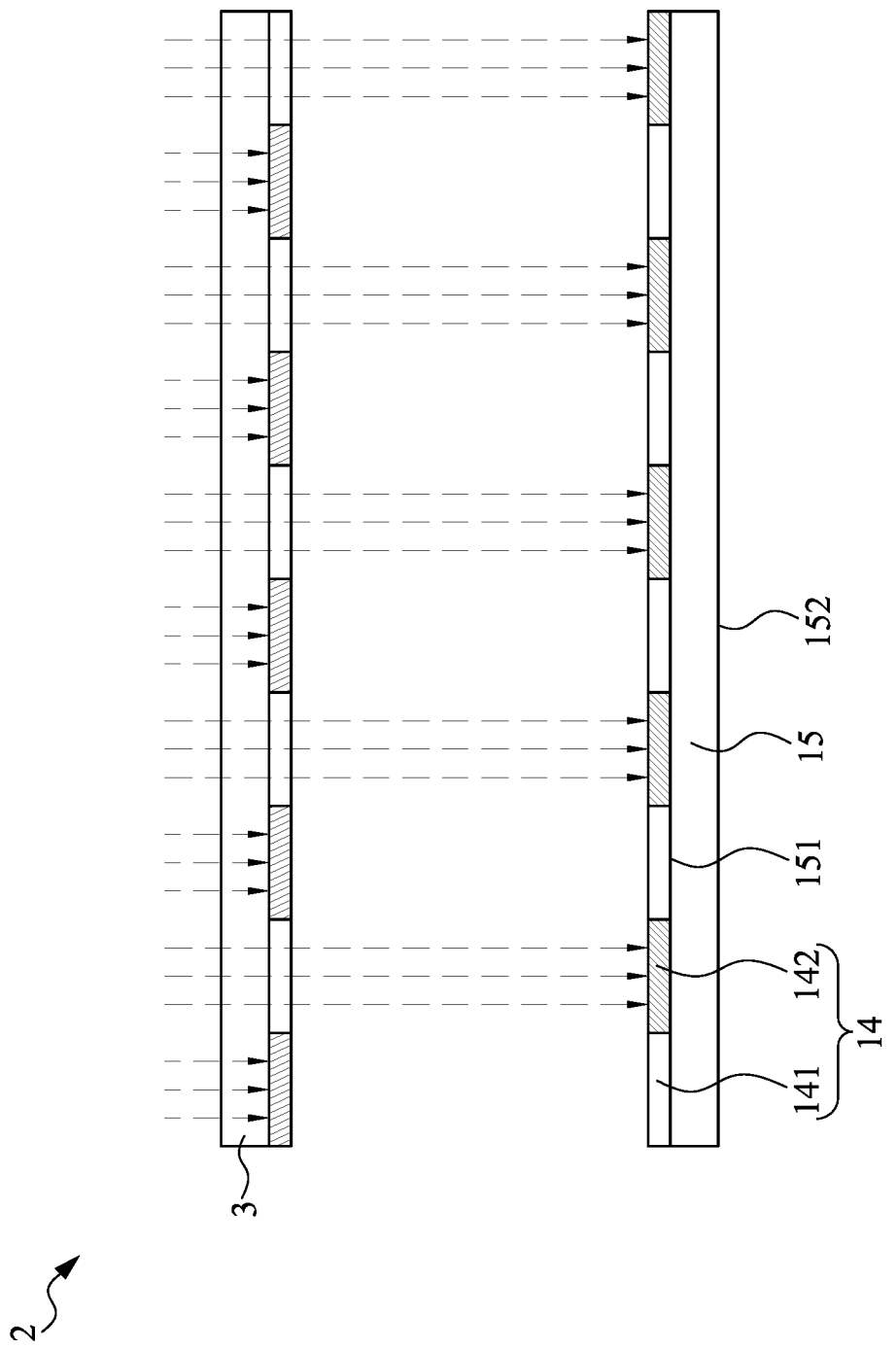
FIG. 2(a) shows an exposure process of the metal-containing film according to an embodiment of the present disclosure.
Figure 2B:
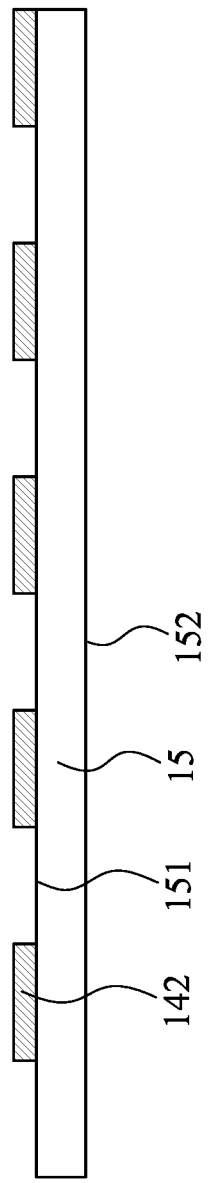
FIG. 2(b) shows a development process of the metal-containing film according to an embodiment of the present disclosure.

The method according to the present disclosure further includes exposing at least a portion of the metal-containing film (14) to EUV radiation. FIG. 2(a) and FIG. 2(b) show that the metal-containing film (14), which is sensitive to EUV radiation and generates primary electrons by absorbing EUV photons, can be patterned directly (i.e., without the use of additional PR) by exposure to EUV radiation (2) with a photomask (3) on which a predetermined pattern is arranged. FIG. 2(a) illustrates the exposure step which results in unexposed portions (141) and exposed portions (142) in the metal-containing film (14).

The metal-containing film (14) according to the present disclosure is an EUV PR. When an EUV photon is absorbed by the metal-containing film (14), a photoelectron is produced. The photoelectrons have energies between about 50 eV or lower to about 100 eV or higher and are randomly scattered in the metal-containing film (14). As a result, some of these highly energetic photoelectrons will propagate through the metal-containing film (14) and generate a cascade of secondary electrons through ionization events along the way. For any given photoelectron, several secondary electrons may be generated, which also propagate in stochastic fashion. As the secondary electrons propagate through metal-containing film (14), it causes the cross-linking events among the organo groups of molecules that constitute the metal-containing film (14). These electrons increase the extent of chemical reactions in the metal-containing film (14), which increases its EUV dose sensitivity.

The reaction chemistry associated with the cross-linking events in the exposed portions (142) of the metal-containing film (14) exemplified in Examples 1 to 4 during the exposure is illustrated as follows:

Example 5

Metal-containing film (14): Sn(Sn$_2$N)$_3$CH$_3$ primitive molecules illustrated in Example 1

Reaction chemistry associated with the cross-linking of the primitive molecules during exposure:

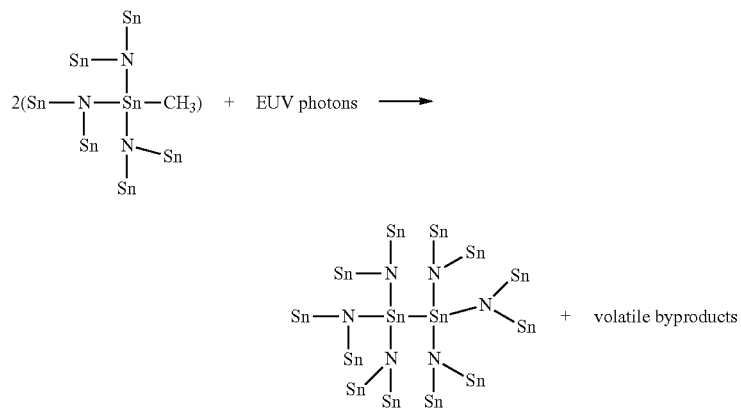

Example 6

Metal-containing film (14): Sn(Sn$_3$Si)$_3$CH$_3$ primitive molecules illustrated in Example 2

Reaction chemistry associated with the cross-linking of the primitive molecules during exposure:

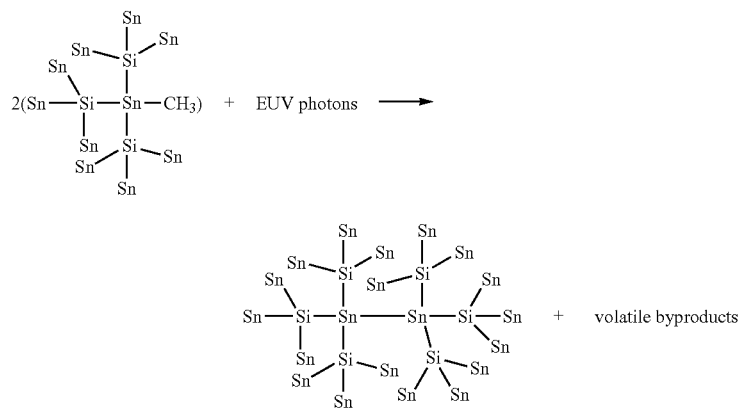

Example 7

Metal-containing film (14): Sb(Sb$_2$N)$_2$CH$_3$ primitive molecules illustrated in Example 3

Reaction chemistry associated with the cross-linking of the primitive molecules during exposure:

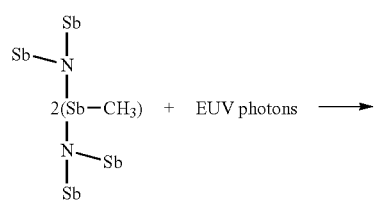

-continued

Metal-containing film (14): Sb(Sb$_2$N)$_2$CH$_3$ primitive molecules illustrated in Example 3

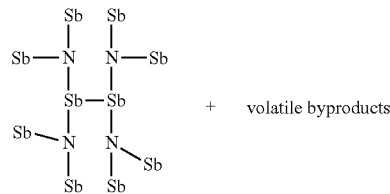

+ volatile byproducts

Example 8

Metal-containing film (14): Sb(Sb$_3$Si)$_2$CH$_3$ primitive molecules illustrated in Example 4

Reaction chemistry associated with the cross-linking of the primitive molecules during exposure:

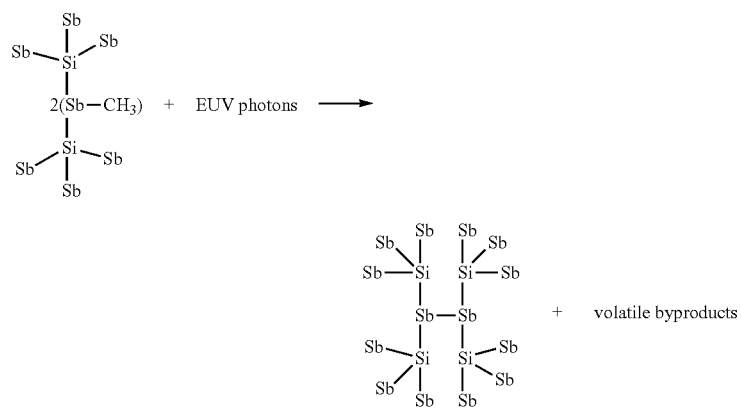

+ volatile byproducts

The same reaction chemistry associated with the cross-linking events during exposure can be applied to the metal-containing film (14) made on the basis of the other organometallic precursors (121) and reactive gaseous species (131) as previously mentioned and is not repeated herein.

The exposure step allows for patterning of the metal-containing film (14) directly by EUV exposure in a vacuum ambient, without the use of additional PRs. Specifically, the formation, processing and transportation of the metal-containing film (14) can be conducted in a vacuum environment. In contrast to CARs, a wafer containing the metal-containing film (14) according to the present disclosure can be moved from one module (e.g., a module for forming the metal-containing film) to another (e.g., the module for lithography) in dry conditions, such that a "dry-in, dry-out" process can be realized and thus degradation due to moisture can be avoided or alleviated. In some embodiments, the module (1) can be integrated with a EUV lithography platform, such as a wafer stepper (e.g., the TWINSCAN NXE series platform supplied by ASML), and the supporting material or substrate (15) with a metal-containing film (14) deposited thereon can be moved under vacuum so as not to react before exposure. Integration with the lithography tool is practical since the EUV lithography platform also requires an environment with a greatly reduced pressure to prevent from the strong optical absorption of the incident photons by ambient gases such as H$_2$O, O$_2$, etc.

The method according to the present disclosure further includes developing the exposed metal-containing film to remove a portion of the metal-containing film. After EUV exposure, the patterned metal-containing film (14) can then be developed. FIG. 2($b$) shows the subsequent step of developing the patterned metal-containing film (14). The wafer containing the exposed metal-containing film (14) may be moved out from the EUV lithography platform to conduct the pattern development. The unexposed portions (141) of the metal-containing film (14) showed in FIG. 2($a$) are removed and the exposed portions (142) are retained. Since the molecules in the unexposed portions (141) have not yet been cross-linked, the unexposed portions (141) have less resistance to the active species (e.g., those from plasma, etching gas or solution) during development than the exposed portions (142) and thus are more readily removable than the exposed portion (142). In some embodiments, the unexposed portions (141) may be removed by a conventional plasma ashing, dry etching system, e.g., reactive ion etching (RIE), or wet development process. It may be desirable to conduct the pattern development outside the EUV lithography system to avoid contaminating the system optics with any incompatible byproducts due to the cross-linking reaction of the metal-containing film (14).

The exposed portions (142) contain cross-linked materials with larger molecular weight than the unexposed portions (141), resulting in a significant decrease in solubility in selective organic solvents. Therefore, the unexposed portions (141) can be removed by use of suitable organic solvents, such as isopropyl alcohol, n-butyl acetate, or 2-heptanone, in a wet development process.

Although the metal-containing film (14) illustrated in the aforementioned embodiments serve as a negative PR, the relative concept according to the present disclosure can be applied to the metal-containing film (14) when serving as a positive PR.

Figure 3A:
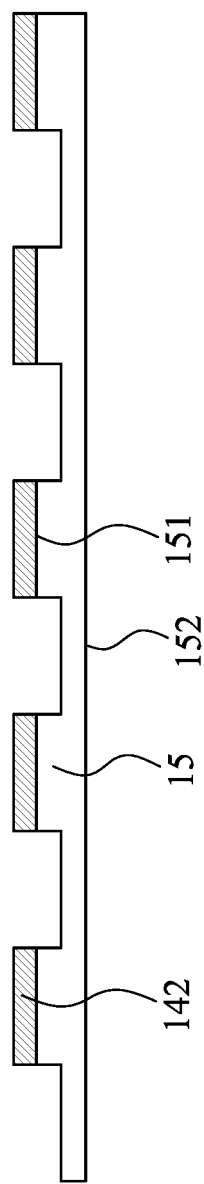
FIG. 3(a) shows a process of transforming the pattern determined on the metal-containing film to a supporting material or substrate arranged on the surface of the metal-containing film opposite to the surface that subjects to EUV irradiation according to an embodiment of the present disclosure.

The metal-containing film (14) may function as a hardmask to transfer its pattern to the underlying supporting material or substrate (15). As shown in FIG. 3(a), after the unexposed portions (141) have been removed during development, the underlying supporting material or substrate (15) is exposed. By employing proper etching means for the supporting material or substrate (15), the predetermined pattern arranged on the metal-containing film (14) can be successfully transferred to the supporting material or substrate (15). In some embodiments, the removal of the unexposed portions (141) illustrated in FIG. 2(b) and the underlying supporting material or substrate (15) illustrated in FIG. 3(a) may be conducted continuously or by the same operation.

Figure 3B:
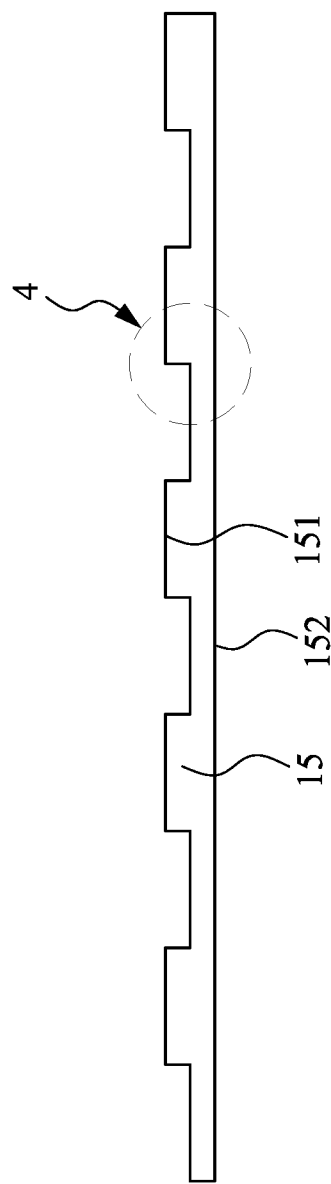
FIG. 3(b) shows the process of removing the patterned metal-containing film from the supporting material or substrate in FIG. 3(a) according to an embodiment of the present disclosure.
Figure 3C:
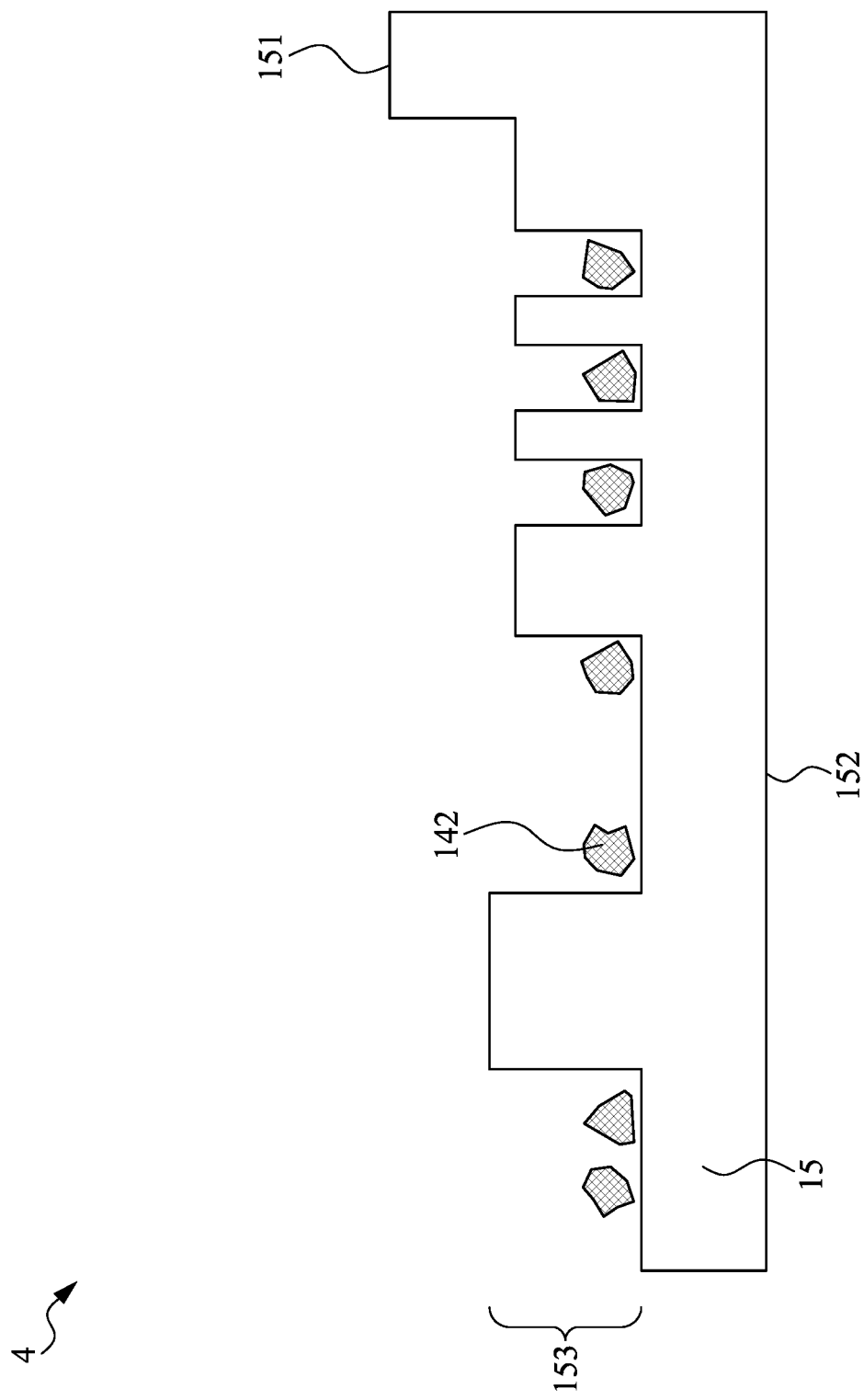
FIG. 3(c) shows the presence of the residue of the metal-containing film on the supporting material or substrate according to an embodiment of the present disclosure after the removal process illustrated in FIG. 3(b).

FIG. 3(b) shows that once the predetermined pattern has been transferred from the metal-containing film (14) to the supporting material or substrate (15), the exposed portion (142) of the patterned metal-containing film (14) can be removed e.g., by existing techniques, such as plasma ashing, dry etching system (e.g., reactive ion etching (RIE)), or wet etching process accordingly. Recessed portions (not denoted) of the supporting material or substrate (15) may be formed as illustrated in FIG. 3(c).

Generally, due to the structural shadowing effects of circuits, if the recessed portions of the supporting material or substrate (15) is non-planar, for example, due to the presence of one or more surface features (153), the metal-containing film (14) may not be completely removable. As shown in FIG. 3(c), which is an enlarged view of the circled portion (4) in FIG. 3(b), the residue of the exposed portion (142) of the metal-containing film (14) may be present on the supporting material or substrate (15). Particularly, the residue of the exposed portion (142) may be present at a corner or edge between the supporting material or substrate (15) and the features (153). The supporting material or substrate (15) and features (153) may be of the same material. The supporting material or substrate (15) and features (153) may be of different materials.

The present disclosure further relates to a semiconductor structure including a supporting material or substrate (15); one or more features (153) on the supporting material or substrate (15); and the residue of the exposed portion (142) of the metal-containing film (14) wherein the residue includes a first metal element having a valence of 2 to 4 chemically bonded with an element having three to five valence electrons and a second metal element having a valence of 2 to 4.

The first metal element is preferably surrounded by two or more of the elements having three to five valence electrons. Preferably, the first metal element is Ti, Zn, Zr, Ru, Sn, Sb, or Hf.

The element having three to five valence electrons is chemically bonded with a third transition element having a valence of 2 to 4. More preferably, the element having three to five valence electrons is selected from elements of Group IIIA, elements of Group IVA and elements of Group VA. The element having three valence electrons is preferably selected from elements of Group IIIA. More preferably, the element having three valence electrons is B, Al, Ga or In. The element having four valence electrons is preferably selected from elements of Group IVA. More preferably, the element having four valence electrons is C, Si, Ge or Sn. The element having five valence electrons is preferably selected from elements of Group VA. More preferably, the element having five valence electrons is N, P, As or Sb.

The second metal element described herein is Ti, Zn, Zr, Ru, Sn, Sb, or Hf, preferably Sn or Sb.

The residue is close or adjacent to the features (153). The residue is on the features (153), for example, on a lateral surface of the features (153).

Comparative Embodiment

In a comparative embodiment where $CO_2$ is used as the reactive gaseous species (131), while not being bound to theory, the inventors believe that the chemistry associated with the method of creating the metal-containing film (14) is as follows:

Example 9

Organo-metallic precursor (121): $SnCl_3CH_3$     Reactive gaseous species (131): $CO_2$ Reaction chemistry: $SnCl_3CH_3 + CO_2 \rightarrow Sn(SnO)_3CH_3$ (primitive molecule) + volatile byproducts

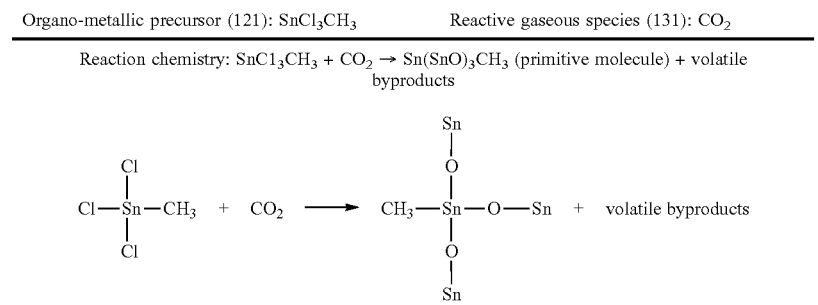

In the above reaction chemistry, the resulting reaction product is represented by a primitive molecule, i.e., $Sn(SnO)_3CH_3$, for simplification. The $Sn(SnO)_3CH_3$ primitive molecule has four tin elements, including one central tin element and three tin elements surrounding the central tin element. Although only the bonding states regarding the central tin element are shown, it should be noted that, each of the tin elements may be bonded with up to three oxygen elements and one methyl group; whereas each of the oxygen elements may be bonded with up to two tin elements.

During the EUV exposure, the following cross-linking reaction chemistry would occur in the exposed portions (142) of the metal-containing film (14):

Example 10

Metal-containing film (14): $Sn(SnO)_3CH_3$ primitive molecules provided in Example 9

Reaction chemistry associated with the cross-linking of the primitive molecules during exposure:

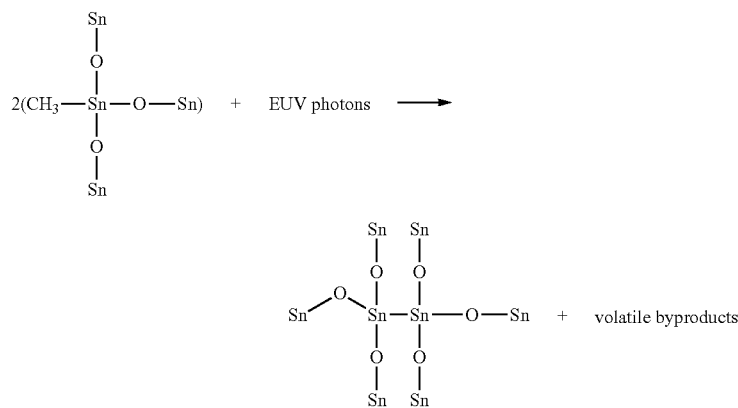

Surprisingly, it is found that the absorption efficiency of the metal-containing film (14) according to the present disclosure at 13.5 nm EUV is at least 25, 50, 75, 100, 125, 150, 175, 200 or 250% greater than that of a metal-containing film (14) formed with carbon dioxide as the reactive gaseous species (131). In some embodiments, the efficiency of the metal-containing film (14) for use as a PR may be evaluated by a flood exposure test. The flood exposure test according to the present disclosure may include the following steps: (1) forming a metal-containing film (14) with a fixed thickness on a plurality of regions of a substrate; (2) applying EUV with different exposure doses to the plurality of regions to expose the metal-containing film (14); (3) developing the exposed metal-containing film (14); and (4) using an extrapolation method to determine the minimum EUV exposure dose (critical dose) that makes the metal-containing film (14) be completely retained after the development step. The metal-containing film (14) according to the present disclosure requires smaller critical dose as compared to the metal-containing film (14) formed with carbon dioxide as the reactive gaseous species (131). The critical dose is inversely proportion to the absorption efficiency of the metal-containing film (14).

In some embodiments according to the present disclosure, the metal-containing film (14) includes seven tin atoms in a primitive molecule and exhibits an absorption efficiency which is 75% greater than that of the metal-containing film according to the comparative embodiment. In some embodiments according to the present disclosure, the metal-containing film (14) includes ten tin atoms in a primitive molecule and exhibits an absorption efficiency which is 150% greater than that of the metal-containing film according to the comparative embodiment. While not being bound to theory, it is believed that the improvement on the absorption efficiency of the metal-containing film (14) according to the present disclosure is due to the increase of the number of the metals per unit volume of the metal-containing film (14). Moreover, as mentioned above, the quantum efficacy of a PR is defined as the ratio of the number of primary electrons generated per unit volume of the PR to the number of EUV photons incident on the unit volume. Since the absorption effect of the metal-containing film (14) according to the present disclosure has been improved, it can be expected that the quantum efficiency of the metal-containing film (14) can be improved in a great extent accordingly.

For ease of description, space-related terms such as "under," "below," "lower portion," "above," "upper portion," "lower portion," "left side," "right side" and the like may be used herein to describe a relationship between one component or feature and another component or feature as shown in the figures. In addition to orientations shown in the figures, space-related terms are intended to encompass different orientations of the device in use or operation. A device may be oriented in other ways (rotated 90 degrees or at other orientations), and the space-related descriptors used herein may also be used for explanation accordingly. It should be understood that when a component is "connected" or "coupled" to another component, the component may be directly connected to or coupled to another component, or an intermediate component may exist.

As used herein, the terms "approximately," "basically," "substantially," and "about" are used for describing and considering a small variation. When used in combination with an event or circumstance, the term may refer to a case in which the event or circumstance occurs precisely, or a case in which the event or circumstance occurs approximately. As used herein with respect to a given value or range, the term "about" generally means in the range of ±10%, ±5%, ±1%, or ±0.5% of the given value or range. The range may be indicated herein as from one endpoint to another endpoint or between two endpoints. Unless otherwise specified, all the ranges indicated in the disclosure include endpoints. The term "substantially coplanar" may refer to two surfaces within a few micrometers (μm) positioned along the same plane, for example, within 10 μm, within 5 μm, within 1 μm, or within 0.5 μm located along the same plane. When reference is made to "substantially" the same numerical value or characteristic, the term may refer to a value within ±10%, ±5%, ±1%, or ±0.5% of the average of the values.

Several embodiments of the disclosure and features of details are briefly described above. The embodiments described in the disclosure may be easily used as a basis for designing or modifying other processes and structures for realizing the same or similar objectives and/or obtaining the same or similar advantages introduced in the embodiments of the disclosure. Such equivalent constructions do not depart from the spirit and scope of the disclosure, and various variations, replacements, and modifications can be made without departing from the spirit and scope of the disclosure.

What is claimed is:

1. A method, comprising
creating a metal-containing film by reacting an organometallic precursor with a reactive gaseous species, wherein the reactive gaseous species comprises an element having three to five valence electrons and one or more radicals selected from hydrogen, $C_1$-$C_3$ alkyl, and $C_1$-$C_3$ alkoxyl to produce a reaction product and depositing the reaction product onto a substrate using vapor deposition to form the metal-containing film.

2. The method according to claim 1, wherein the metal-containing film is sensitive to extreme ultraviolet (EUV).

3. The method according to claim 1, wherein the element having three to five valence electrons is selected from elements of Group IIIA, elements of Group IVA and elements of Group VA.

4. The method according to claim 1, wherein the element having three to five valence electrons is B, Al, Ga, In, C, Si, Ge, Sn, N, P, As or Sb.

5. The method according to claim 1, wherein the radical is H, $CH_3$ or $OCH_3$.

6. The method according to claim 1, wherein the reactive gaseous species is $B_2H_6$, $CH_4$, $SiH_4$, $GeH_4$, $SnH_4$, $NH_3$, $PH_3$, $AsH_3$ or $SbH_3$.

7. The method according to claim 1, wherein the organometallic precursor has the following formula: $M(R^1)_w(R^2)_x(R^3)_y(R^4)_z$, in which M denotes a metal element having a valence of 2 to 4,
$R^1$ to $R^4$, each independently, denote a halogen element, $C_1$-$C_6$ alkyl, $C_1$-$C_6$ alkoxyl, an amido group, a $C_1$-$C_6$ alkylamino group, or a (di-$C_1$-$C_6$ alkyl) amino group,
w, x, y and z, each independently, denote an integer of 0 to 4,
wherein $2 \leq w+x+y+z \leq 4$, and at least one of $R^1$, $R^2$, $R^3$ and $R^4$ denotes $C_1$-$C_6$ alkyl, $C_1$-$C_6$ alkoxyl, an amido group, a $C_1$-$C_6$ alkylamino group, or a (di-$C_1$-$C_6$ alkyl) amino group.

8. The method according to claim 6, wherein the metal element is Ti, Zn, Zr, Ru, Sn, Sb, or Hf.

9. The method according to claim 6, wherein the organometallic precursor is $Ti(CH_3)_4$, $TiCl(CH_3)_3$, $TiCl_2(CH_3)_2$, $TiCl_3CH_3$, $ZnClCH_3$, $Zn(CH_3)_2$, $Zr(CH_3)_4$, $ZrCl(CH_3)_3$, $ZrCl_2(CH_3)_2$, $ZrCl_3CH_3$, $Ru(CH_3)_4$, $RuCl(CH_3)_3$, $RuCl_2(CH_3)_2$, $RuCl_3CH_3$, $Sn(CH_3)_4$, $SnCl(CH_3)_3$, $SnCl_2(CH_3)_2$, $SnCl_3CH_3$, $SbCl(CH_3)_2$, $SbCl_2CH_3$, $Sb(CH_3)_3$, $Hf(CH_3)_4$, $HfCl(CH_3)_3$, $HfCl_2(CH_3)_2$, $HfCl_3CH_3$, $Ti(OCH_3)_4$, $TiCl(OCH_3)_3$, $TiCl_2(OCH_3)_2$, $TiCl_3OCH_3$, $ZnClOCH_3$, $Zn(OCH_3)_2$, $Zr(OCH_3)_4$, $ZrCl(OCH_3)_3$, $ZrCl_2(OCH_3)_2$, $ZrCl_3OCH_3$, $Ru(OCH_3)_4$, $RuCl(OCH_3)_3$, $RuCl_2(OCH_3)_2$, $RuCl_3OCH_3$, $Sn(OCH_3)_4$, $SnCl(OCH_3)_3$, $SnCl_2(OCH_3)_2$, $SnCl_3OCH_3$, $SbCl(OCH_3)_2$, $SbCl_2OCH_3$, $Sb(OCH_3)_3$, $Hf(OCH_3)_4$, $HfCl(OCH_3)_3$, $HfCl_2(OCH_3)_2$, $HfCl_3OCH_3$, $Ti(NH_2)_4$, $TiCl(NH_2)_3$, $TiCl_2(NH_2)_2$, $TiCl_3NH_2$, $ZnClNH_2$, $Zn(NH_2)_2$, $Zr(NH_2)_4$, $ZrCl(NH_2)_3$, $ZrCl_2(NH_2)_2$, $ZrCl_3NH_2$, $Ru(NH_2)_4$, $RuCl(NH_2)_3$, $RuCl_2(NH_2)_2$, $RuCl_3NH_2$, $Sn(NH_2)_4$, $SnCl(NH_2)_3$, $SnCl_2(NH_2)_2$, $SnCl_3NH_2$, $SbCl(NH_2)_2$, $SbCl_2NH_2$, $Sb(NH_2)_3$, $Hf(NH_2)_4$, $HfCl(NH_2)_3$, $HfCl_2(NH_2)_2$, $HfCl_3NH_2$, $Ti(NHCH_3)_4$, $TiCl(NHCH_3)_3$, $TiCl_2(NHCH_3)_2$, $TiCl_3NHCH_3$, $ZnClNHCH_3$, $Zn(NHCH_3)_2$, $Zr(NHCH_3)_4$, $ZrCl(NHCH_3)_3$, $ZrCl_2(NHCH_3)_2$, $ZrCl_3NHCH_3$, $Ru(NHCH_3)_4$, $RuCl(NHCH_3)_3$, $RuCl_2(NHCH_3)_2$, $RuCl_3NHCH_3$, $Sn(NHCH_3)_4$, $SnCl(NHCH_3)_3$, $SnCl_2(NHCH_3)_2$, $SnCl_3NHCH_3$, $SbCl(NHCH_3)_2$, $SbCl_2NHCH_3$, $Sb(NHCH_3)_3$, $Hf(NHCH_3)_4$, $HfCl(NHCH_3)_3$, $HfCl_2(NHCH_3)_2$, $HfCl_3NHCH_3$, $Ti[N(CH_3)_2]_4$, $TiCl[N(CH_3)_2]_3$, $TiCl_2[N(CH_3)_2]_2$, $TiCl_3N(CH_3)_2$, $ZnClN(CH_3)_2$, $Zn[N(CH_3)_2]_2$, $Zr[N(CH_3)_2]_4$, $ZrCl[N(CH_3)_2]_3$, $ZrCl_2[N(CH_3)_2]_2$, $ZrCl_3N(CH_3)_2$, $Ru[N(CH_3)_2]_4$, $RuCl[N(CH_3)_2]_3$, $RuCl_2[N(CH_3)_2]_2$, $RuCl_3N(CH_3)_2$, $Sn[N(CH_3)_2]_4$, $SnCl[N(CH_3)_2]_3$, $SnCl_2[N(CH_3)_2]_2$, $SnCl_3N(CH_3)_2$, $SbCl[N(CH_3)_2]_2$, $SbCl_2N(CH_3)_2$, $Sb[N(CH_3)_2]_3$, $Hf[N(CH_3)_2]_4$, $HfCl[N(CH_3)_2]_3$, $HfCl_2[N(CH_3)_2]_2$ or $HfCl_3N(CH_3)_2$.

10. The method according to claim 1, further comprising exposing at least a portion of the metal-containing film to extreme ultraviolet (EUV) radiation.

11. The method according to claim 10, further comprising developing the exposed metal-containing film to remove a portion of the metal-containing film.

12. The method according to claim 1, wherein the absorption efficiency of the metal-containing film at 13.5 nm EUV is at least 25%, 50%, 75%, 100, 125, 150, 175, 200 or 250% greater than the absorption efficiency of a metal-containing film formed with carbon dioxide as the reactive gaseous species at 13.5 nm EUV.

13. The method according to claim 1, wherein the metal-containing film is an element of a semiconductor structure.

14. The method according to claim 1, wherein the metal-containing film is an EUV photoresist.

* * * * *